US011110647B2

(12) United States Patent
Marcoe et al.

(10) Patent No.: US 11,110,647 B2
(45) Date of Patent: Sep. 7, 2021

(54) ADAPTIVE COMPOSITE STRUCTURE USING SHAPE MEMORY ALLOYS

(71) Applicant: The Boeing Company, Chicago, IL (US)

(72) Inventors: Jeffery L. Marcoe, Bellevue, WA (US); Sahrudine Apdalhaliem, Seattle, WA (US); Moushumi Shome, Kent, WA (US)

(73) Assignee: The Boeing Company, Chicago, IL (US)

( * ) Notice: Subject to any disclaimer, the term of this patent is extended or adjusted under 35 U.S.C. 154(b) by 492 days.

(21) Appl. No.: 15/963,890

(22) Filed: Apr. 26, 2018

(65) Prior Publication Data

US 2018/0243972 A1 Aug. 30, 2018

Related U.S. Application Data

(62) Division of application No. 14/332,412, filed on Jul. 16, 2014, now Pat. No. 9,981,421.

(51) Int. Cl.
*B29C 61/06* (2006.01)
*B64C 3/48* (2006.01)
(Continued)

(52) U.S. Cl.
CPC .......... *B29C 61/0625* (2013.01); *B29B 11/16* (2013.01); *B29C 70/222* (2013.01);
(Continued)

(58) Field of Classification Search
CPC ... B29C 61/0625; B29C 70/222; B29C 70/30; B29C 70/32; B29C 70/88; B29C 53/822;
(Continued)

(56) References Cited

U.S. PATENT DOCUMENTS 4,770,915 A 9/1988 Nakagawa et al.
5,076,871 A 12/1991 Frye et al.
(Continued)

FOREIGN PATENT DOCUMENTS

DE 10039586 A1 2/2002
EP 1420094 A1 5/2004
(Continued)

OTHER PUBLICATIONS

Canadian Office Action dated Feb. 6, 2017 in Canadian Patent Application No. 2,888,065 (Canadian counterpart of the parent of the instant divisional patent Application).
(Continued)

*Primary Examiner* — Assres H Woldemaryam
*Assistant Examiner* — Aaron M Rodziwicz
(74) *Attorney, Agent, or Firm* — Ostrager Chong Flaherty & Broitman P.C.

(57) ABSTRACT

Systems and processes that integrate thermoplastic and shape memory alloy materials to form an adaptive composite structure capable of changing its shape. For example, the adaptive composite structure may be designed to serve as a multifunctional adaptive wing flight control surface. Other applications for such adaptive composite structures include in variable area fan nozzles, winglets, fairings, elevators, rudders, or other aircraft components having an aerodynamic surface whose shape is preferably controllable. The material systems can be integrated by means of overbraiding (interwoven) with tows of both thermoplastic and shape memory alloy materials or separate layers of each material can be consolidated (e.g., using induction heating) to make a flight control surface that does not require separate actuation.

20 Claims, 9 Drawing Sheets

(51) Int. Cl.

| | | |
|---|---|---|
| *B64C 3/52* | (2006.01) | |
| *B29C 70/88* | (2006.01) | |
| *B29B 11/16* | (2006.01) | |
| *B29C 70/32* | (2006.01) | |
| *B29C 70/22* | (2006.01) | |
| *B29C 70/30* | (2006.01) | |
| *B32B 15/08* | (2006.01) | |
| *F03G 7/06* | (2006.01) | |
| *H05K 1/05* | (2006.01) | |
| *H05K 1/16* | (2006.01) | |
| *B64C 3/44* | (2006.01) | |
| *B64C 27/72* | (2006.01) | |
| *B64C 3/54* | (2006.01) | |
| *B29C 53/82* | (2006.01) | |
| *B29K 71/00* | (2006.01) | |
| *B29K 267/00* | (2006.01) | |
| *B29L 31/30* | (2006.01) | |

(52) U.S. Cl.
CPC ............. *B29C 70/30* (2013.01); *B29C 70/32* (2013.01); *B29C 70/88* (2013.01); *B32B 15/08* (2013.01); *B64C 3/48* (2013.01); *B64C 3/52* (2013.01); *F03G 7/065* (2013.01); *H05K 1/056* (2013.01); *H05K 1/165* (2013.01); *B29C 53/822* (2013.01); *B29K 2071/00* (2013.01); *B29K 2267/00* (2013.01); *B29L 2031/3085* (2013.01); *B32B 2250/02* (2013.01); *B32B 2605/18* (2013.01); *B64C 2003/445* (2013.01); *B64C 2003/543* (2013.01); *B64C 2027/7288* (2013.01); *H05K 2201/0129* (2013.01); *H05K 2201/0308* (2013.01); *Y02T 50/30* (2013.01); *Y02T 50/40* (2013.01)

(58) Field of Classification Search
CPC .......... B29B 11/16; B29B 15/08; B64C 3/48; B64C 3/52; B64C 2003/543; B64C 2003/445; B64C 2027/7288; H05K 1/056; H05K 1/165; H05K 2201/0129; H05K 2201/0308; Y02T 50/30; Y02T 50/40
See application file for complete search history.

(56) References Cited

U.S. PATENT DOCUMENTS

| | | | |
|---|---|---|---|
| 5,226,470 A | 7/1993 | Lemoine et al. | |
| 5,337,647 A | 8/1994 | Roberts et al. | |
| 5,614,305 A | 3/1997 | Paine et al. | |
| 5,700,337 A * | 12/1997 | Jacobs ................. | B32B 27/281 156/64 |
| 5,728,309 A | 3/1998 | Matsen et al. | |
| 5,804,276 A | 9/1998 | Jacobs et al. | |
| 6,156,842 A | 12/2000 | Hoenig et al. | |
| 6,182,929 B1 * | 2/2001 | Martin ..................... | B64C 3/48 244/219 |
| 6,349,903 B2 * | 2/2002 | Caton ................... | B64C 27/615 244/213 |
| 7,744,038 B2 | 6/2010 | Sankrithi et al. | |
| 8,118,264 B2 * | 2/2012 | Mabe ................... | B64C 13/341 244/213 |
| 8,256,719 B2 * | 9/2012 | Wood ....................... | B64C 3/48 244/200 |
| 8,534,611 B1 * | 9/2013 | Pitt .......................... | B64C 3/50 244/214 |
| 8,925,870 B1 * | 1/2015 | Gordon .................... | B64C 3/28 244/200 |
| 9,051,683 B2 | 6/2015 | Brumbelow et al. | |
| 9,120,554 B2 * | 9/2015 | Shome ...................... | B64C 3/48 |
| 9,415,856 B2 * | 8/2016 | Rawdon ................... | B64C 3/48 |
| 9,598,167 B2 * | 3/2017 | Grip ......................... | B64C 3/50 |
| 10,344,402 B2 | 7/2019 | Sanders ................... | D01F 9/08 |
| 2007/0202296 A1 * | 8/2007 | Chandrasekaran ..... | C22C 14/00 428/124 |
| 2009/0255531 A1 | 10/2009 | Johnson et al. | |
| 2011/0030380 A1 * | 2/2011 | Widdle, Jr. ............. | F02K 1/386 60/771 |
| 2011/0281052 A1 * | 11/2011 | Dewhirst ............ | B29C 53/8075 428/36.9 |
| 2012/0183178 A1 | 7/2012 | Fabre et al. | |
| 2012/0183718 A1 * | 7/2012 | Fabre .................. | B32B 38/0012 428/67 |
| 2012/0191178 A1 | 7/2012 | Laduca et al. | |
| 2013/0075529 A1 * | 3/2013 | Marcoe .................... | B64C 3/18 244/131 |
| 2013/0309925 A1 * | 11/2013 | Seike .................. | D06M 15/423 442/60 |
| 2014/0041713 A1 * | 2/2014 | Adler ....................... | H05B 3/26 136/251 |
| 2014/0102578 A1 * | 4/2014 | Bartel .................. | B29C 70/205 138/123 |
| 2016/0209492 A1 | 7/2016 | Grandin et al. | |

FOREIGN PATENT DOCUMENTS

| | | |
|---|---|---|
| JP | 2003278051 A | 10/2003 |
| WO | 2006046008 A1 | 5/2006 |
| WO | 2014058551 A1 | 4/2014 |

OTHER PUBLICATIONS

Extended European Search Report dated Nov. 24, 2015 in European Patent Application No. 15176550.0 (European counterpart of the parent of the instant divisional patent application).

Canadian Office Action dated Mar. 15, 2016 in Canadian Patent Application No. 2,888,065 (Canadian counterpart of the parent of the instant divisional U.S. patent Application).

Chinese Office Action dated May 28, 2018 in Chinese Patent Application No. 2015104198228 (Chinese counterpart of the parent of the instant divisional patent application).

* cited by examiner

ADAPTIVE COMPOSITE STRUCTURE USING SHAPE MEMORY ALLOYS

RELATED PATENT APPLICATION

This application is a divisional of and claims priority from U.S. patent application Ser. No. 14/332,412 filed on Jul. 16, 2014.

BACKGROUND

The present disclosure relates generally to adaptive composite structures capable of changing their shape and, more particularly, to control surfaces (e.g., flight control surfaces) having an adaptive composite structure.

Conventional aircraft typically include a variety of movable aerodynamic devices for controlling the pitch, yaw and roll of the aircraft and for altering the lift characteristics of the aircraft. For example, fixed wing aircraft may include ailerons mounted to the trailing edge of the wings for roll control of the aircraft. The wings may also include flaps or slats mounted to the leading edge of the wings and which may be deployed or deflected downwardly from the wings during certain phases of flight in order to maintain airflow over the wing at high angles of attack.

Flaps may be also mounted to the trailing edges of the wings to increase the amount of lift generated by the wings when the aircraft is moving through the air at relatively slow speeds. Trailing edge flaps are typically deflected downwardly during takeoff to increase lift and are then retracted during the cruise portion of a flight. The flaps may again be deflected downwardly during the approach and landing phases of the flight to reduce the landing speed of the aircraft.

Typically a flight control surface comprises structural and system (e.g., actuation) components which are separate and not integrated until at an assembly level, adding weight and cost to an airplane wing trailing edge structure. A flight control surface that does not require separate actuation is desirable.

SUMMARY

The subject matter disclosed herein is directed to systems and processes that integrate thermoplastic and shape memory alloy (SMA) materials to form an adaptive composite structure capable of changing its shape. For example, the adaptive composite structure may be designed to serve as a multifunctional adaptive wing flight control surface. Overall, such design is multifunctional in fulfilling structural and flight control systems specifications. Other applications include incorporating such adaptive composite structures in variable area fan nozzles, winglets, fairings, elevators, rudders, or any other aircraft components having an aerodynamic surface whose shape is preferably controllable. The systems and processes disclosed herein can also be applied to other transportation vehicles (e.g., spoilers used on automobiles and race cars) as well as on wind blades. All of these applications use control surfaces that can benefit from adaptive composite structure using shape memory alloys. The material systems can be integrated by means of overbraiding (interwoven) an expandable mandrel with tows of both thermoplastic and SMA materials or wrapping separate layers (woven or continuous) of each material around an expandable mandrel or any combination of one or more overbraided layers and one or more separate layers of material, and then consolidating and forming the layers surrounding the expandable mandrel in an induction heating tool assembly to make an adaptive composite structure that does not require separate actuation. Induction heating with smart susceptors may be used for consolidation and temperature control during the fabrication process.

The adaptive composite structure, when installed on an aircraft, has an outer mold line which changes shape as the adaptive composite structure deforms in response to heating or cooling of SMA material (also referred to herein as "an SMA actuator"). The SMA actuators can be heated in different ways. In accordance with one embodiment, an SMA actuator is heated by supplying electrical power to a heating blanket which lies adjacent to the SMA actuator. In accordance with another embodiment, an SMA actuator is heated by supplying electrical power to the SMA actuator directly. In accordance with a further embodiment, an SMA actuator is heated by a smart susceptor which lies adjacent to the SMA actuator, which smart susceptor in turn is heated due to eddy currents induced in the smart susceptor by an alternating magnetic field produced by induction coils incorporated in the adaptive composite structure.

One aspect of the subject matter disclosed in detail below is a pre-form comprising tows made of thermoplastic material interwoven with tapes or wires made of shape memory alloy.

Another aspect of the disclosed subject matter is a system comprising a mandrel having an exterior surface and a pre-form in contact with the exterior surface and supported by the mandrel, wherein the pre-form comprises thermoplastic material and shape memory alloy. In accordance with one embodiment, the pre-form comprises tows made of thermoplastic material interwoven with tapes or wires made of shape memory alloy. In accordance with another embodiment, the pre-form comprises a first layer comprising shape memory alloy and a second layer comprising thermoplastic material without shape memory alloy, the first layer being disposed between the exterior surface of the mandrel and the second layer. In one implementation of the latter embodiment, the shape memory alloy of the first layer is in the form of a continuous sheet or a multiplicity of tapes or wires. In another implementation of that same embodiment, the first layer comprises tows made of thermoplastic material interwoven with tapes or wires made of shape memory alloy.

A further aspect of the subject matter disclosed in detail below is an aerodynamic device comprising first and second skins, each of the first and second skins comprising shape memory alloy and thermoplastic material. In accordance with one embodiment, the first skin comprises thermoplastic material and tapes or wires made of shape memory alloy material embedded in the thermoplastic material. In accordance with another embodiment, the first skin is a lamination comprising an inner layer comprising shape memory alloy and an outer layer comprising thermoplastic material without shape memory alloy, the inner layer being disposed inside the outer layer. In one implementation of the latter embodiment, the inner layer comprises thermoplastic material and tapes or wires made of shape memory alloy at least partly embedded in the thermoplastic material of the inner layer.

The aerodynamic device described in the preceding paragraph further comprises means for heating the shape memory alloy. At least some of the shape memory alloy of the first skin and at least some of the shape memory alloy of the second skin are trained to deform in a specified manner in response to being heated. In accordance with one embodiment, the structure that performs the heating function comprises a first heating blanket thermally coupled to the shape memory alloy of the first skin and a second heating blanket thermally coupled to the shape memory alloy of the second skin. In accordance with another embodiment, the shape memory alloy of the first skin comprises a first multiplicity of wires, the shape memory alloy of the second skin comprises a second multiplicity of wires, and the structure that performs the heating function comprises a first electrical conductor electrically connected to respective ends of the first multiplicity of wires and a second electrical conductor electrically connected respective ends of the second multiplicity of wires. In accordance with a further embodiment, the structure that performs the heating function comprises an induction coil and a smart susceptor thermally coupled to the shape memory alloy of the first skin, wherein the smart susceptor is disposed relative to the induction coil such that eddy currents will be induced in the smart susceptor when the induction coil is activated to generate an alternating magnetic field.

Yet another aspect is a method for fabricating a composite structure comprising: overbraiding a heat-expandable mandrel with tows of thermoplastic material and tapes or wires made of shape memory alloy; placing the overbraided mandrel between first and second susceptors disposed between first and second tooling dies of an induction heating workcell; energizing one or more induction coils of the induction heating workcell to produce alternating magnetic fields which cause the first and second susceptors to produce heat, which heat in turn melts the thermoplastic material, softens the shape memory alloy, and expands the mandrel; de-energizing the induction coils of the induction heating workcell after the thermoplastic material has been consolidated to a desired degree and a composite structure has been formed; removing the mandrel and composite structure from the induction heating workcell; and separating the mandrel from the composite structure. This method may further comprise training at least some of the shape memory alloy incorporated in the composite structure. Preferably, the mandrel is made of soluble material and separating the mandrel from the composite structure comprises solubilizing the soluble material of the mandrel.

A further aspect of the subject matter disclosed herein is a method for fabricating a composite structure comprising: placing a pre-form around and in contact with an exterior surface of a heat-expandable mandrel, wherein the pre-form comprises thermoplastic material and shape memory alloy; placing the mandrel and pre-form between first and second susceptors disposed between first and second tooling dies of an induction heating workcell; energizing one or more induction coils of the induction heating workcell to produce alternating magnetic fields which cause the first and second susceptors to produce heat, which heat in turn melts the thermoplastic material, softens the shape memory alloy, and expands the mandrel; de-energizing the induction coils of the induction heating workcell after the thermoplastic material has been consolidated to a desired degree and a composite structure has been formed; removing the mandrel and composite structure from the induction heating workcell; and separating the mandrel from the composite structure. In accordance with some embodiments, the pre-form comprises tows made of thermoplastic material interwoven with tapes or wires made of shape memory alloy. In accordance with other embodiments, the pre-form comprises a first layer comprising shape memory alloy and a second layer comprising thermoplastic material without shape memory alloy, the first layer being disposed between the exterior surface of the mandrel and the second layer.

Other aspects of adaptive composite structures which integrate thermoplastic and SMA materials are disclosed below.

BRIEF DESCRIPTION OF THE DRAWINGS

Reference will hereinafter be made to the drawings in which similar elements in different drawings bear the same reference numerals.

DETAILED DESCRIPTION

The following detailed disclosure describes methods and apparatus for consolidating and molding/forming a pre-form comprising thermoplastic and shape memory alloy materials and wrapped around a soluble expandable mandrel. These materials may take many different forms. The methodologies disclosed below are suitable for fabricating adaptive composite structures, such as adaptive aerodynamic surfaces of an aircraft.

Figure 1:
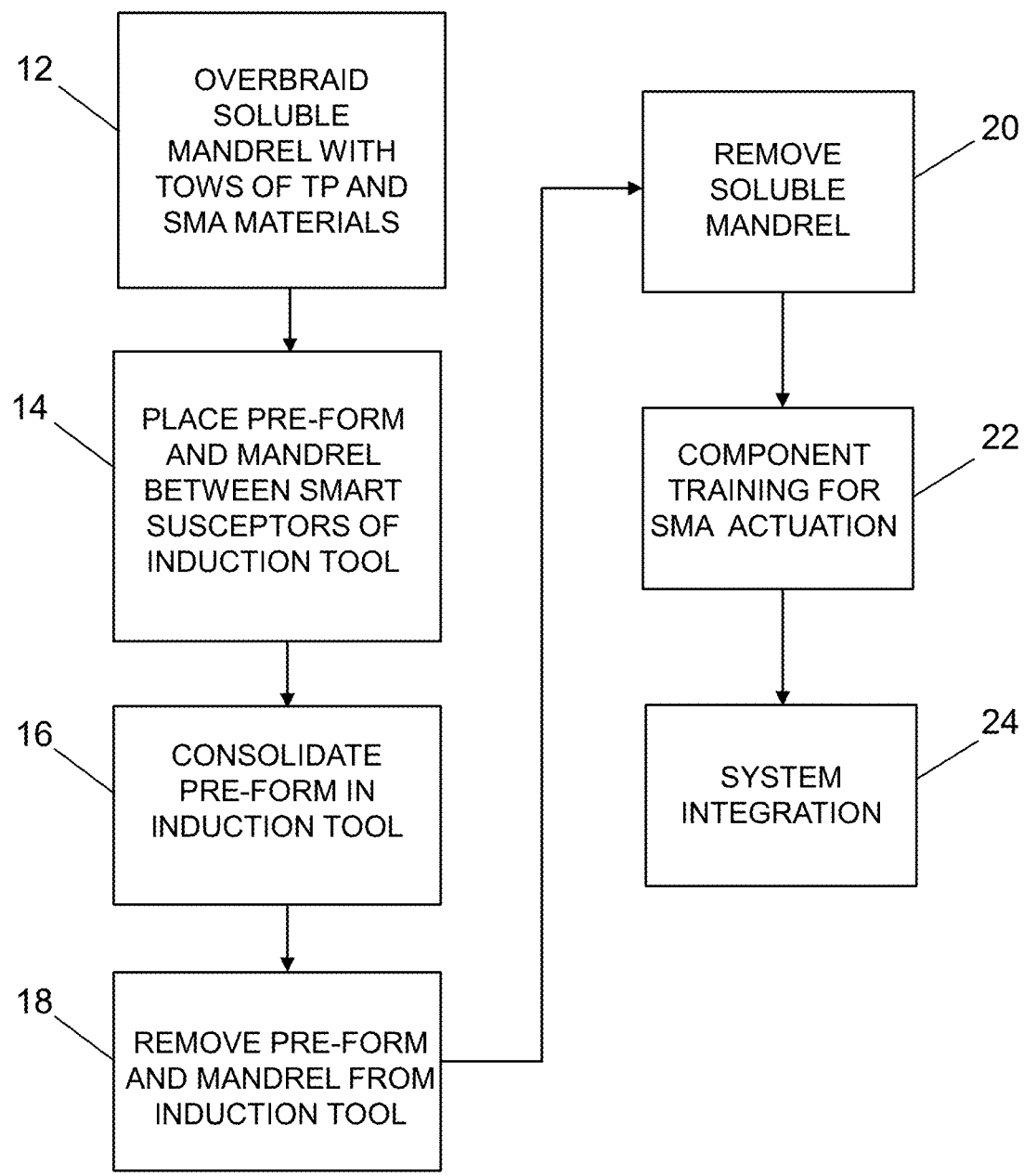
FIG. 1 is a flowchart showing steps of a process for integrating thermoplastic and shape memory alloy materials to form an adaptive composite structure for incorporation in an aircraft or other system in accordance with one embodiment.

FIG. 1 is a flowchart showing steps of a process in accordance with one embodiment for integrating thermoplastic (TP) and shape memory alloy (SMA) materials to form an adaptive composite structure for incorporation in an aircraft or other system. This method comprises: overbraiding a heat-expandable mandrel with tows of thermoplastic (TP) material (e.g., tows comprising TP resin reinforced by TP fibers) and tapes or wires made of shape memory alloy (SMA) material (step 12) to form a pre-form; placing the mandrel and overbraided pre-form between a pair of smart susceptors disposed between first and second tooling dies of an induction heating workcell (step 14); consolidating the pre-form (step 16) by energizing one or more induction coils of the induction heating workcell to produce alternating magnetic fields which cause the first and second susceptors to produce heat, which heat in turn melts the thermoplastic material, softens the shape memory alloy, and expands the mandrel, thereby exerting pressure on the pre-form; de-energizing the induction coils of the induction heating workcell after the thermoplastic material has been consolidated to a desired degree and a composite structure has been formed; removing the mandrel and composite structure from the induction heating workcell (step 18); separating the mandrel from the composite structure (step 20); training the shape memory alloy so that it is capable of actuating a change in shape of the composite structure in response to heating (step 22); and integrating the trained composite structure as a component in a larger system (step 24). Preferably, the mandrel is made of soluble material and separating the mandrel from the composite structure comprises solubilizing the soluble material of the mandrel.

In accordance with the method depicted n FIG. 1, one or more layers of overbraided (interwoven) TP and SMA materials can be placed around the expandable mandrel. This is typically done using a braiding apparatus comprising a multiplicity of bobbins from which tows of TP and SMA materials are unwound, as will be described in more detail below with reference to FIGS. 2 and 3. In accordance with alternative embodiments, one or more layers of TP and SMA materials woven on a loom can be placed around an expandable mandrel.

In accordance with further alternative embodiments, one or more layers of TP material and one or more layers of SMA material (each layer being woven or continuous) can be separately wrapped around an expandable mandrel with a relatively outer layer made of TP material surrounding a relatively inner layer made of SMA material. For example, the pre-form surrounding the expandable mandrel may comprise a woven or continuous layer of SMA material sandwiched between two woven or continuous layers of TP material.

In accordance with other embodiments, any combination of one or more overbraided or woven TP/SMA layers and one or more separate layers of woven or continuous TP material can be combined to form a pre-form around the exterior surface of an expandable mandrel.

Regardless of the particular combination and configuration of the TP and SMA materials used to create the pre-form, the TP material of the pre-form is consolidated and formed in an induction heating tool assembly to make a composite structure. One TP material which is suitable for use in aerodynamic devices comprises polyetherketoneketone (PEKK) resin and polyester fibers. For flight control applications, preferably the SMA material is not exposed on the exterior surface of the adaptive composite structure, but rather is covered by or embedded in the TP material during consolidation and forming.

After the composite structure has been formed and removed from the induction heating tool assembly, the SMA material in the composite structure can be trained to give the composite structure the ability to change its shape when the SMA material is heated or cooled with specified temperature ranges. The SMA material can be trained to produce a desired memory effect during such heating or cooling. More specifically, the SMA material in the composite structure can be trained to bend (deform) (optionally, to different degrees) during heating and then return to an undeformed state during cooling. It should be appreciated that the SMA material must be trained in accordance with the constrained motion of the composite structure that is desired. The SMA material can be trained for different degrees of motion based on designs of different "trainers" (mechanical mechanisms used to train a shape memory alloy to maintain its memory shape).

The two main types of shape memory alloys are copper-aluminum-nickel, and nickel-titanium (nitinol) alloys but shape memory alloys can also be created by alloying zinc, copper, gold, and iron. In various embodiments, the SMA material may be nitinol, though various other shape memory alloys of copper, zinc, aluminum, nickel, titanium, palladium, and/or other materials can be used as well. The transition temperature of a shape memory alloy is highly sensitive to the composition of the alloy and can be selected by slightly varying the constituent ratios. The choice of SMA material can be made based upon various design considerations such as operating temperature ranges, desired transition temperatures, desired transition times, combinations thereof, and the like.

Shape memory alloys exhibit thermo-mechanical properties that are useful in constructing thermally actuatable devices. Generally, a shape memory alloy is a metallic alloy that has distinctly different phases on opposing sides of a transition temperature. A shape memory alloy reaches a first physical state when it is below its transition temperature and a second physical state when it is above its transition temperature. Some SMA materials can be trained to have a first shape for the cooler first state and a second shape for the warmer second state. A two-way trained shape memory alloy can forcibly assume the second shape when heated above the transition temperature and then gently return, if not otherwise restricted, to the first shape when cooled to below the transition temperature.

Figure 2:
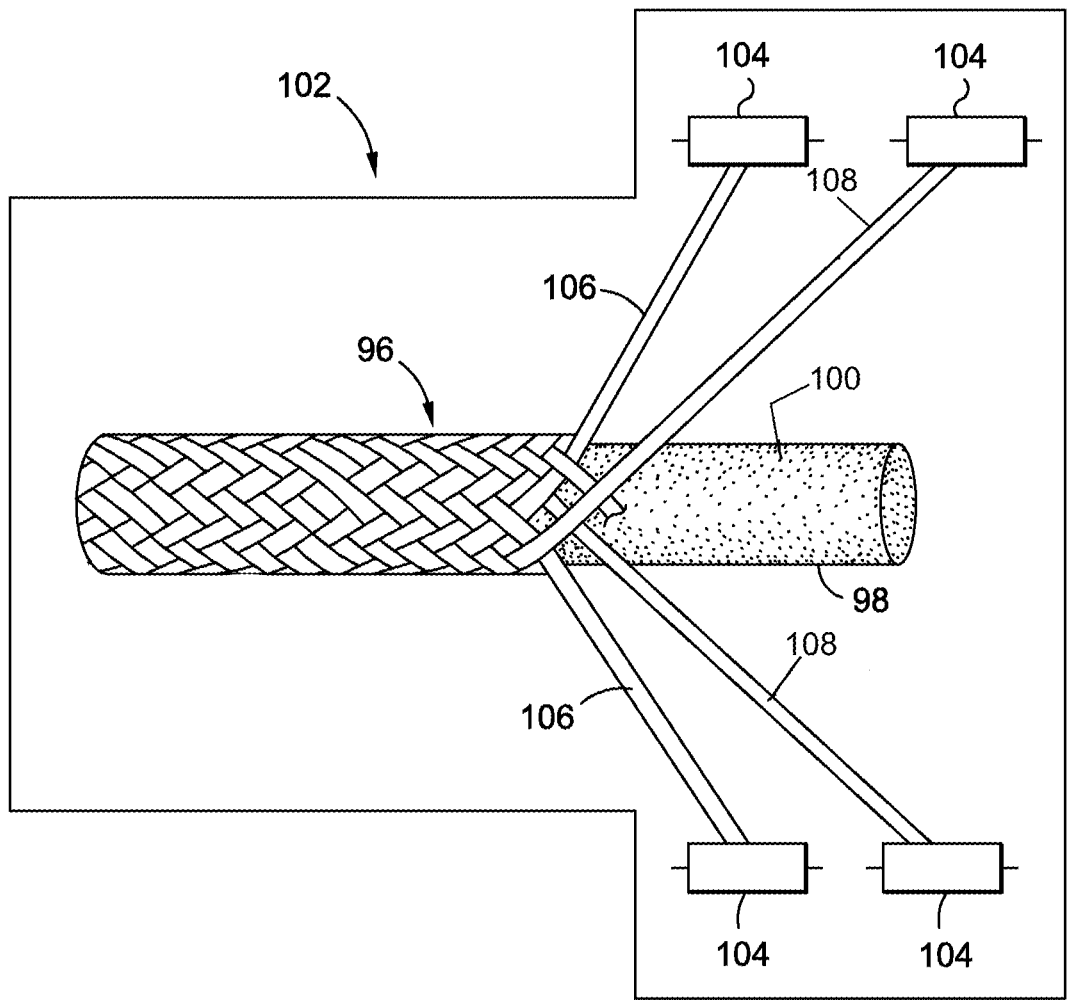
FIG. 2 is a diagram representing a top view of some components of a braiding apparatus for overbraiding tows of material around a mandrel in accordance with the embodiment depicted in FIG. 1.

FIG. 2 is a top view depicting some components of a braiding apparatus 102 for overbraiding tows of TP material 106 and tapes or wires of SMA material 108 around a mandrel 98 in accordance with the embodiment depicted in FIG. 1. In this depiction, the mandrel 98 is shown in the process of being overbraided with tows of TP material 106 and tapes or wires of SMA material 106 over an exterior surface 100 of the mandrel 98. The tows of TP material 106 are preferably in a form consisting of a continuous slit tape thermoplastic material. In the example depicted in FIG. 2, the mandrel 98 has the form of a solid rod of circular cross section. However, it should be appreciated that this circular shape is shown for the purpose of illustration only and that the cross-sectional shape of the mandrel 98 will depend on the desired cross-sectional shape of the composite structure being formed on the mandrel. For example, the mandrel 98 may be an airfoil-shaped body.

As seen on the left-hand side of FIG. 2, the tows of TP material 106 and tapes or wires of SMA material 108 are interwoven by the braiding apparatus 102 to form a pre-form 96 of overbraided material on the exterior surface 100 of the mandrel 98. Preferably, the overbraiding of the mandrel 98 is carried out at ambient temperature. A braiding apparatus or machine known in the art may be used to overbraid the mandrel. Preferably, the known braiding apparatus or machine has the capability of accommodating changes to the tow thickness, gauge, bias angle along the length, cross-sectional shape, cross-sectional angular path along the length, and number of tows. A suitable three-dimensional braiding apparatus is disclosed in U.S. Pat. No. 5,337,647, the disclosure of which is incorporated herein in its entirety. During the overbraiding process, the tows of TP material 106 and tapes or wires of SMA material 108 are unwound from respective bobbins 104 of the braiding apparatus 102, while the mandrel 98 is moved incrementally along an axis of the braiding apparatus. The overbraiding 96 is laid on the exterior surface 100 of the mandrel 98 as the mandrel is moved in this axial direction. The preferred overbraiding approach is for the expandable soluble mandrel to go through a braiding wheel. A typical braiding wheel is shown in FIG. 17 of U.S. Pat. No. 6,769,840.

In the example depicted in FIG. 2, the mandrel 98 is a solid circular rod having an axis. However, the mandrel may have other exterior shapes, such as airfoil shapes. During the braiding operation, the mandrel 98 is moved incrementally along its own axis, which is disposed parallel to the axis of the braiding apparatus. In cases where the mandrel has an airfoil shape, the spanwise axis of the airfoil shape will be aligned with the axis of the braiding apparatus.

Figure 3:
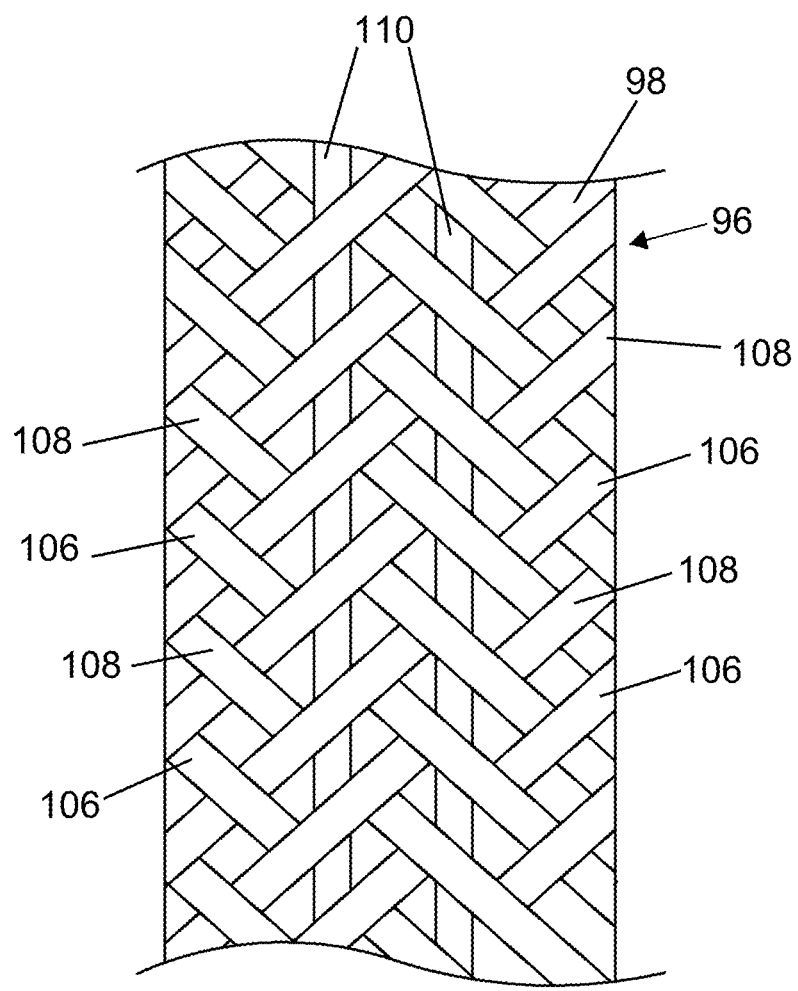
FIG. 3 is a diagram representing a magnified top view of an overbraided mandrel with a triaxial overbraid that may be produced using a braiding apparatus of the type partly depicted in FIG. 2.

FIG. 3 is a diagram representing a magnified top view of one example of an overbraided mandrel 98 with a triaxial overbraid 96 that may be produced using a braiding apparatus of the type partly depicted in FIG. 2. In this example, the overbraiding 96 comprises alternating diagonal tows of TP material 106, diagonal tapes or wires of SMA material 108, and axial tows of TP material 110. Although the tows are depicted with spacing in FIG. 3, it should be understood that as part of the process of creating the overbraided pre-form, the interwoven tows will be periodically compacted along the mandrel to substantially remove such spacing.

The methods of fabricating composite structures disclosed herein involve placing the pre-form and heat-expandable mandrel into an inductively heated matched tooling assembly having a pair of mutually opposing smart susceptor tool faces. The pre-form and heat-expandable mandrel are placed between the smart susceptors. The appropriate susceptor chemistry is selected to provide the desired initial leveling temperature at the surface of the tool during heating of the pre-form. The smart susceptors create the sheet metal shell that forms the face of the inductively heated matched tooling. The mandrel expands and the thermoplastic material melts in response to heating by the smart susceptors.

Figure 4:
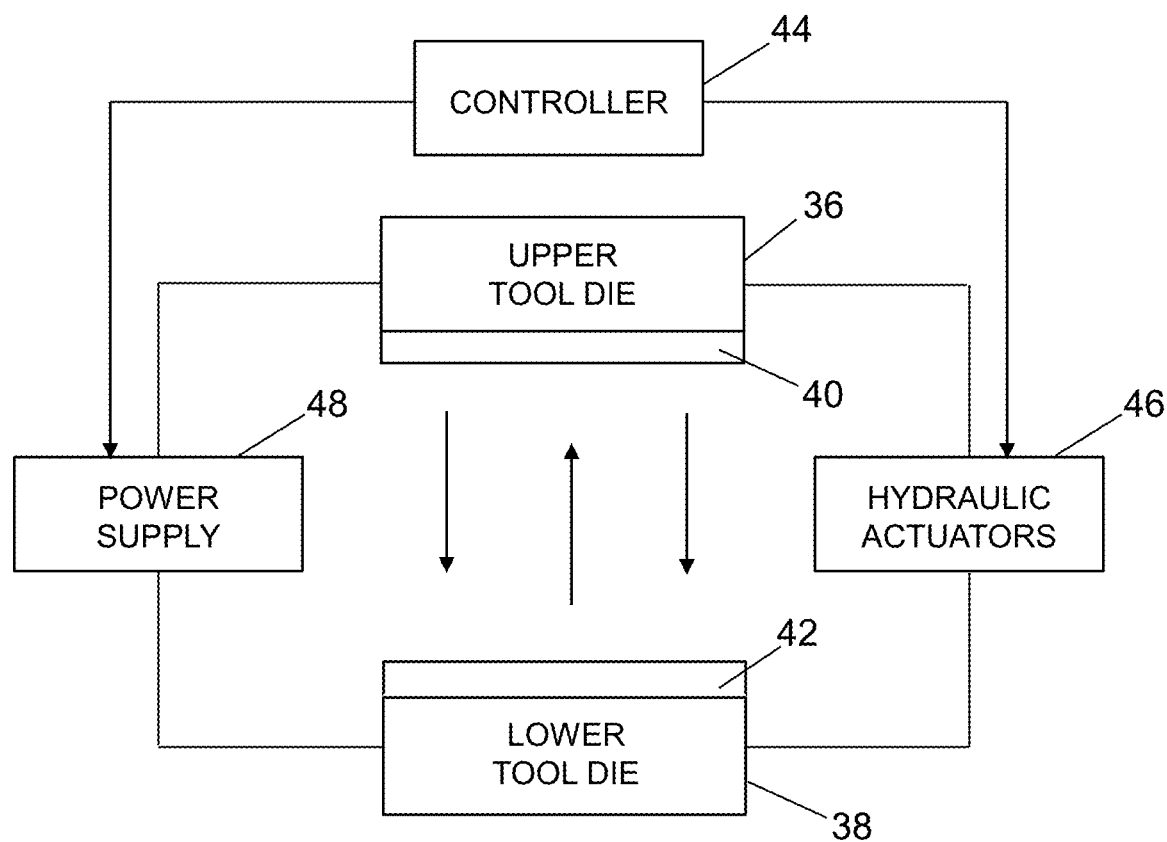
FIG. 4 is a block diagram showing components of a computer-controlled system for consolidating and forming a pre-form made of thermoplastic and shape memory alloy materials.

FIG. 4 shows components of a computerized system for performing the consolidation/molding process in accordance with some embodiments. The system comprises a lower die frame (not shown in the drawings), a lower tooling die 38 supported by the lower die frame and having a first contoured die surface (not shown in FIG. 4, but see FIGS. 5A and 5B), an upper die frame (not shown), and an upper tooling die 36 supported by the upper die frame and having a second contoured die surface (not shown in FIG. 4, but see FIGS. 5A and 5B). The mandrel and pre-form (not shown in FIG. 4) will be placed between the contoured die surfaces of the lower and upper tooling dies 36 and 38. The contoured die surfaces may define a complex shape, such as an airfoil.

The die frames act as mechanical constraints to keep the lower and upper tooling dies 36 and 38 together and to maintain the dimensional accuracy of the dies. The die frames may be coupled to hydraulic actuators 46, which move the dies toward and away from each other. In addition, one or more induction coils (not shown in FIG. 4) extend through each of the upper and lower tooling dies 36 and 38 to form an induction heater for raising the temperature of the pre-form to at least its consolidation temperature. A thermal control system (not shown) may be connected to the induction coils.

Still referring to FIG. 4, the apparatus further comprises an upper susceptor 40 and a lower susceptor 42 made of electrically and thermally conductive material. The susceptors and the induction coils are positioned so that the susceptors can be heated by electromagnetic induction. The lower susceptor 42 may generally conform to the contoured die surface of the lower die tool 38 and the upper susceptor 40 may generally conform to the contoured die surface of the upper die tool 36. The mandrel and pre-form (not shown in FIG. 4) are placed between the upper and lower susceptors 40 and 42.

In some cases, it is preferred that the temperature at which a pre-form is consolidated should not exceed a certain temperature. To this end, the upper and lower susceptors 40 and 42 are preferably so-called "smart susceptors". A smart susceptor is constructed of a material, or materials, that generate heat efficiently until reaching a threshold (i.e., Curie point) temperature. As portions of the smart susceptor reach the Curie temperature, the magnetic permeability of those portions falls to unity (i.e., the susceptor becomes paramagnetic) at the Curie temperature. This drop in magnetic permeability has two effects: it limits the generation of heat by those portions at the Curie temperature, and it shifts the magnetic flux to the lower temperature portions, causing those portions below the Curie temperature to more quickly heat up to the Curie temperature. Accordingly, thermal uniformity of the heated pre-form during the forming process can be achieved irrespective of the input power fed to the induction coils by judiciously selecting the material for the susceptor. In accordance with one embodiment, each susceptor is a layer or sheet of magnetically permeable material. Preferred magnetically permeable materials for constructing the susceptors include ferromagnetic materials that have an approximately 10-fold decrease in magnetic permeability when heated to a temperature higher than the Curie temperature. Such a large drop in permeability at the critical temperature promotes temperature control of the susceptor and, as a result, temperature control of the part being manufactured. Ferromagnetic materials include iron, cobalt, nickel, gadolinium and dysprosium, and alloys thereof.

In accordance with one embodiment, the susceptors are formed of ferromagnetic materials including a combination of iron, nickel, chromium and/or cobalt, with the particular material composition chosen to produce a set temperature point to which the susceptor is heated in response to the electromagnetic energy generated by the induction heating coil. In this regard, the susceptor may be constructed such that the Curie point of the susceptor at which there is a transition between the ferromagnetic and paramagnetic phases of the material defines the set temperature point to which the susceptor is inductively heated.

The consolidation/molding apparatus shown in FIG. 4 may further comprise a cooling system (not shown) comprising respective sets of cooling conduits distributed in the upper and lower tooling dies 36 and 38. Each set of coolant conduits is coupled via respective manifolds to a source of cooling medium, which may be liquid, gas or a gas/liquid mixture such as mist or aerosol. The cooling system can be activated in order to quench the back sides of the smart susceptors after consolidation and forming of the pre-form.

In a typical implementation of a consolidation and molding process, the mandrel and pre-form are initially positioned between the upper and lower tooling dies of the stacked tooling apparatus. Then the tooling dies are moved toward each other by hydraulic actuators 46 until they reach their respective tool-closed positions. During the consolidation process, oscillating electrical power is supplied to the induction coils by a power supply 48. The supplied electrical power produces an oscillating magnetic flux which rapidly heats the upper and lower susceptors 40 and 42 to their leveling temperature, which in turn heat the pre-form. During this process, the mandrel will expand and the pre-form will be molded by the opposing contoured (or planar) surfaces of the susceptors 40 and 42.

After consolidation and cooling, the hydraulic actuators 46 move the upper and lower tooling dies 36 and 38 apart to allow removal of the consolidated and formed composite structure from the mold. The hydraulic actuators 46 and the power supply 48 (and also the coolant supply, which is not shown in FIG. 4) operate under the control of a controller 44. The controller 44 may be a computer or processor comprising a processing unit (e.g., a central processing unit) and some form of memory (i.e., computer-readable medium) for storing a program which is readable by the processing unit.

The computer program may include settable process parameters for controlling the operation of the electrical power supply and hydraulic actuators. For example, the controller 44 may be programmed to control the electrical power supply 48 and the hydraulic actuators 46 as follows: (a) controlling the electrical power supply 48 to apply a varying low-strength magnetic field having a magnetic flux that passes through surfaces of the smart susceptors until the smart susceptors are heated to a leveling temperature; (b) controlling the hydraulic actuators 46 to apply compressive force to the pre-form equal to a consolidation pressure at least during a time period subsequent to the time when the temperature of the smart susceptors reaches the leveling temperature.

The upper and lower tooling dies 36 and 38 may be made of ceramic and reinforced with a plurality of fiberglass rods that extend longitudinally and transversely in a grid through each die. The dies should not be susceptible to inductive heating so that heating is localized in the retort formed by the susceptors rather than distributed in the press as well. A ceramic that has a low coefficient of thermal expansion, good thermal shock resistance, and relatively high compression strength is preferred, such as a castable fused silica ceramic. Portions of an induction coil are embedded in the dies. In a typical induction heating workcell, respective cavities in the upper and lower tooling dies hold respective tool inserts 36 and 38.

Figure 5A:
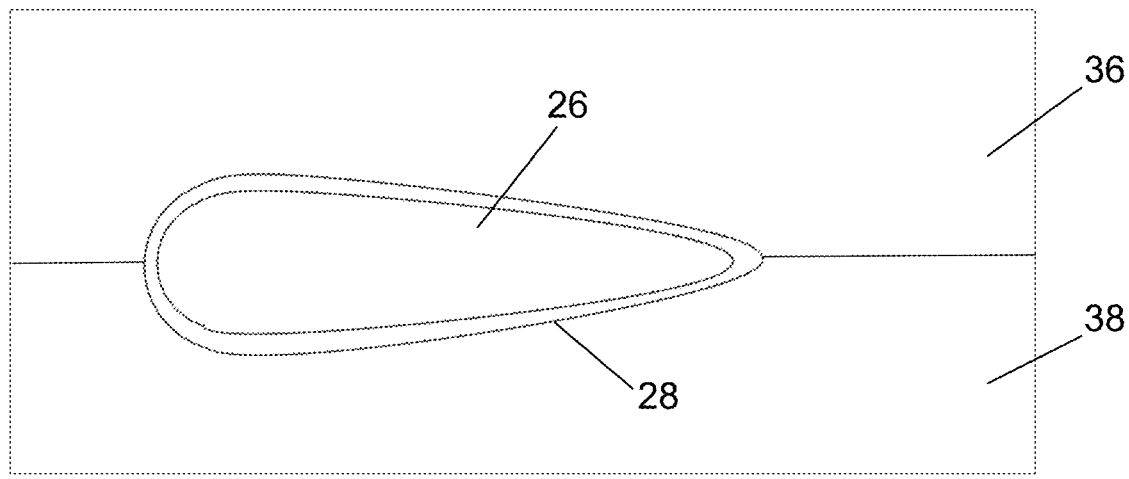
FIG. 5A is a diagram representing a sectional view of an inductively heated matched tooling assembly for consolidating and forming a pre-form made of overbraided thermoplastic and shape memory alloy materials laid on an expandable mandrel.

FIG. 5A is a diagram representing a sectional view of an inductively heated matched tooling assembly for consolidating and forming a pre-form 28 made of overbraided TP and SMA materials laid on an expandable mandrel 26. The inductively heated matched tooling assembly comprises an upper tooling die 36 and a lower tooling die 38. The upper and lower smart susceptors are not shown in FIG. 5A. The mandrel 26 has an exterior surface designed to form the inner mold line of an airfoil-shaped body, such as a trailing edge flight control device. The confronting surfaces of the smart susceptors, which may generally follow the contours of the adjoining inner surfaces of the upper and lower tooling dies 36 and 38, are designed to form the outer mold line of the airfoil-shaped body, The mandrel 26 is made of a soluble material that expands when heated. During heating of the pre-form 28, the mandrel 26 will expand to increase the pressure being exerted on the pre-form by the matched tooling assembly. Soluble expandable mandrels can be made to shape as needed. The selected material can be injected into a mold or it can be cast as needed. The induction heating tooling would also be designed to fit the airfoil part shape outer mold line as needed.

Figure 5B:
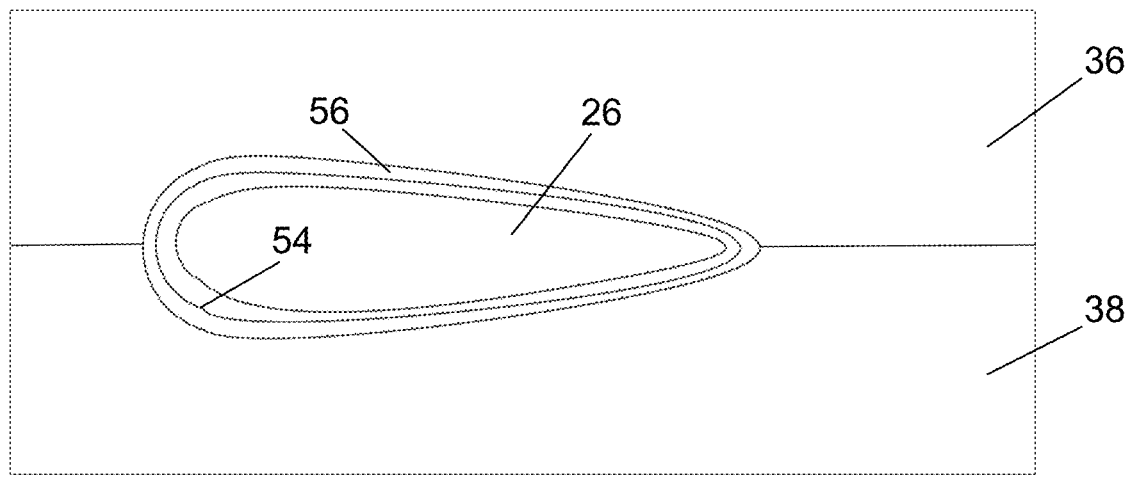
FIG. 5B is a diagram representing a sectional view of an inductively heated matched tooling assembly for consolidating and forming a pre-form comprising an outer layer of thermoplastic material and an inner layer of shape memory alloy material laid on an expandable mandrel.

FIG. 5B is a diagram representing a sectional view of an inductively heated matched tooling assembly comprising upper and lower tooling dies 36 and 38 (the smart susceptors are not shown) for consolidating and forming a pre-form comprising an inner layer 54 consisting entirely or partially of SMA material laid on and around an expandable mandrel 26 and an outer layer 56 of TP material (without SMA material) laid on and around the inner layer 54. Optionally, a third (i.e., innermost) pre-form layer made of TP material may be disposed between the inner layer 54 and the mandrel 26. The inner and outer layers 54 and 56 may be continuous sheets of material or interwoven tows. In accordance with one implementation, the inner layer 54 may comprise an overbraiding of tows made of TP material and tapes or wires made of SMA material, while the outer layer 56 comprises a continuous sheet or interwoven tows made of TP material.

The upper and lower tooling dies 36 and 38 may be made of ceramic and reinforced with a plurality of fiberglass rods that extend longitudinally and transversely in a grid through each die. The dies should not be susceptible to inductive heating so that heating is localized in the retort formed by the susceptors rather than distributed in the press as well. A ceramic that has a low coefficient of thermal expansion, good thermal shock resistance, and relatively high compression strength is preferred, such as a castable fused silica ceramic. Portions of an induction coil (not shown in FIGS. 5A and 5B) are embedded in the dies. In a typical induction heating workcell, respective cavities in the upper and lower tooling dies hold respective tool inserts (also not shown in FIGS. 5A and 5B). The upper tool insert in some applications has a contoured forming surface that has a shape corresponding to the desired shape of the outer mold line surface of the completed composite structure. The lower tool insert determines the inner mold line. The tool inserts also should not be susceptible to inductive heating, preferably being formed of a castable ceramic. A pair of susceptors (not shown in FIGS. 5A and 5B) are placed between the tool inserts 46 and 48, forming a retort surrounding the pre-form and mandrel. The retort is heated to a forming or consolidation temperature by energizing the induction coil. Further details concerning the operation of an induction heating workcell that uses smart susceptors can be found in U.S. Pat. No. 5,728,309, the contents of which are incorporated by reference herein in their entirety.

The retort with installed pre-form and mandrel is heated in accordance with a specified heating profile in order to consolidate the thermoplastic material and form an airfoil-shaped composite structure. For example, the melting point of the TP materials used herein is in a range of about 575 to 650° F., while the melting point of SMA materials is in a range of about 1,000 to 1,200° F., in which case the consolidation temperature may be in the range of 700 to 710° F. Although an inductively heated matched tooling assembly has been disclosed, other suitable heating apparatus can be utilized (e.g., a convection oven). Pressure can be applied internally using the expandable material of the airfoil-shaped mandrel 26. Heat and pressure are applied in a manner intended to cause consolidation of the TP material and deformation of the SMA material.

As previously discussed with reference to the method shown in FIG. 1, after consolidation and formation of the composite structure, the matched tooling assembly is cooled in accordance with a specified cooling profile. After cooling, the mandrel and composite structure are removed from the matched tooling assembly, and then the mandrel is separated from the composite structure. In accordance with some embodiments, the mandrel is made of a water-soluble material, in which case the mandrel can be removed from the composite structure by solubilizing the soluble material in water or a water-based solution. Material compositions suitable for use in a soluble expandable mandrel are disclosed in U.S. Patent Application Publ. No. 2014/0102578, the contents of which are incorporated by reference herein in their entirety. For example, the mandrel may comprise graphite and ceramic.

The result of the fabrication processes described in detail above is a composite structure comprising shape memory alloy that can be trained to actuate a change in shape of the composite structure which will be consistent with the operations of a flight control surface. Suitably trained composite structure can be installed along the trailing edges of wings on an aircraft. The principle of actuation is realized by change of shape (i.e., deformation) of the SMA material rather than by movement of cooperating mechanical parts. In accordance with the embodiments disclosed herein, the deformable actuators comprise shape memory alloys which have been trained to change shape in specific manners when heated. The position and orientation of the active portions of the embedded SMA material in the final composite structure will depend on the particular application, but in flight control applications, the active portions of SMA material should be capable of producing chordwise changes in the contours of the upper and lower skins of the flight control surface.

Two-way training typically entails thermo-mechanical cycles wherein the SMA object is forced into the desired martensitic and austenitic shapes at respective low and high temperatures.

The composite structures disclosed herein may utilize pairs of mutually antagonistic one-way SMA actuators. In these embodiments, the SMA material is heated to transition from its martensitic shape (i.e., its shape when its crystalline state is martensite) to its austenitic shape (i.e., its shape when its crystalline state is austenite), thereby generating actuation forces for changing the shape of the composite structure. Each one-way SMA actuator changes from its martensitic shape to its austenitic shape when heated sufficiently, stops changing shape when its heating element is de-energized, but then returns to its original shape when the other one-way SMA actuator changes from its martensitic shape to its austenitic shape (although the unheated actuator provides a resistance force that opposes the actuation force produced by the heated actuator).

Figure 6:
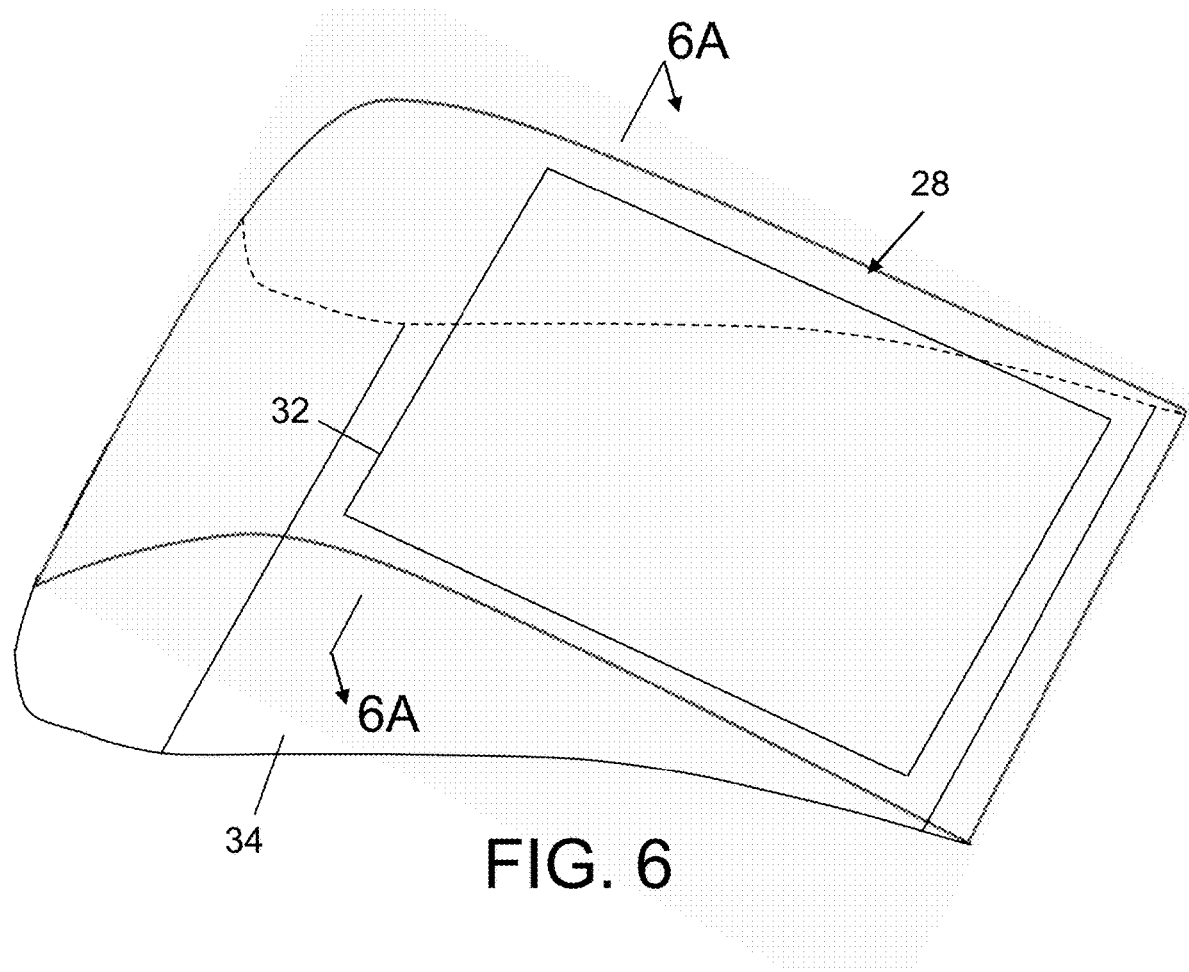
FIG. 6 is a diagram representing an isometric view of a wing trailing edge flight control surface that incorporates SMA actuators in accordance with one embodiment.
Figure 6A:
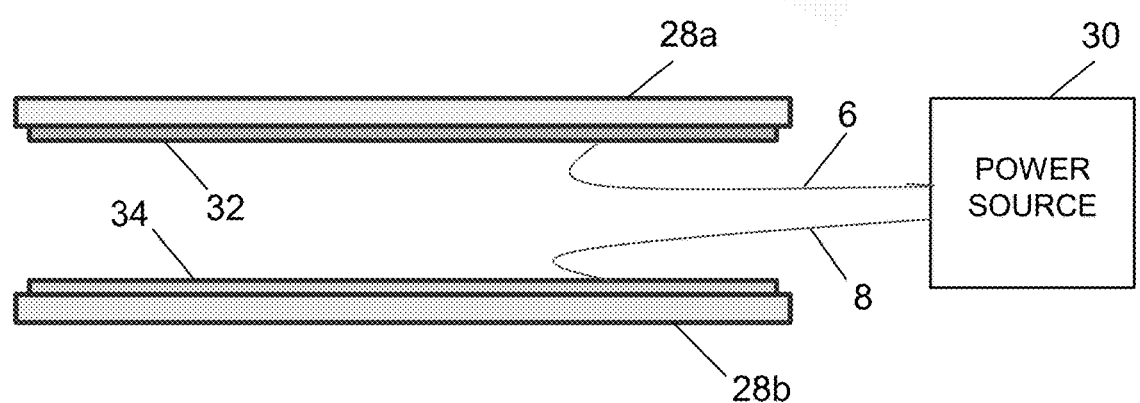
FIG. 6A is a diagram representing a sectional view of the wing trailing edge flight control surface schematically depicted in FIG. 6, the section being taken through a plane 6A-6A indicated in FIG. 6.

In accordance with alternative embodiments, two-way SMA actuators can be used instead of paired one-way actuators. To enable two-way reversible actuation, the active portion of each SMA actuator can be fabricated from a two-way shape memory alloy adapted to transition, without an externally applied load, between a first trained shape and a second trained shape when the two-way shape memory alloy is thermally cycled between a first temperature and a second temperature to switch the two-way shape memory alloy from a first state to a second state FIG. 6 is a diagram representing an isometric view of a wing trailing edge flight control surface 28 that incorporates SMA material embedded in TP material in accordance with one embodiment. FIG. 6A is a diagram representing a sectional view of the wing trailing edge flight control surface schematically depicted in FIG. 6, the section being taken through a plane 6A-6A indicated in FIG. 6. Active (i.e., trained) portions of the SMA material (not shown in FIGS. 6 and 6A) embedded in the upper and lower skins 28a and 28b (see FIG. 6A) of the flight control surface are thermally coupled to respective heating blankets 32 and 34, which are adhered to the interior surfaces of the upper and lower skins 28a and 28b respectively. The heating blankets 32 and 34 are positioned to heat the respective active portions of the SMA material. The heating blankets 32 and 34 receive electrical power from an electrical power supply 30 by way of respective electrical conductors 6 and 8. Preferably the forward portion of the flight control surface 28 is made of a material which is not susceptible to heat-induced shape change. For example, the forward portion can be made of shape memory alloy which has not been trained to change shape at the aforementioned transition temperature.

When supplied with electrical power, the heating blankets 32 and 34 heat up the active portions of the SMA material, which active portions have been trained to deform during heating from a respective first shape to a respective second shape. The heating blankets 32 and 34 are lightweight when compared to some previously used actuators. The resulting deformation of the heated trained SMA material changes the configuration of the flight control surface.

In accordance with one implementation, the heating blankets 32 and 34 may comprise foil heaters attached to respective interior surfaces of the upper and lower skins 28a and 28b. Each foil heater comprises conductive foil that that has been etched to form a serpentine pattern. During manufacturing, the foil is mounted to a backing and then etched into the desired pattern. The etched foil is then laid up in a dielectric matrix (e.g. silicone), connections (e.g., conductive foil tabs or wires) are led out of the matrix, and the matrix is then consolidated (removing the backing if necessary). Each foil heater is thermally coupled to respective active portions of the SMA material and comprises a serpentine electrical conductor which is connected to the electrical power source 30 by means of a pair of electrical conductors 6 and 8. As electrical current flows through the serpentine electrical conductors of the foil heaters, the active portions of the SMA material will change state in response to sufficient heating.

In an exemplary embodiment, the first state of the two-way shape memory alloy is an austenitic state and the second state is a martensitic state. When thermally activated or heated, the two-way shape memory alloy begins to enter the austenitic state at its austenite start temperature (temperature at which the transformation from martensite to austenite begins on heating). During this martensite-to-austenite transformation, the two-way SMA actuator deforms toward the first trained or austenitic shape. With continued heating, the two-way shape memory alloy eventually completes the martensite-to-austenite transformation at its austenite finish temperature (temperature at which the transformation from martensite to austenite finishes on heating). It should be understood that the austenite start and finish temperatures and rate of the martensite-to-austenite transformation can vary depending on the particular application and its thermal environment, the composition of the shape memory alloy materials being used, and/or the amount and rate of thermal energy applied to the two-way SMA actuator.

Upon cooling, the two-way shape memory alloy begins to enter a martensitic state at its martensite start temperature (temperature at which the transformation from austenite to martensite begins on cooling). During this austenite-to-martensite transformation, the two-way SMA actuator deforms toward the second trained or martensitic shape. With continued cooling, the two-way shape memory alloy eventually completes the austenite-to-martensite transformation at its martensite finish temperature (temperature at which the transformation from austenite to martensite finishes on cooling). It should be understood that the martensite start and finish temperatures and rate of the austenite-to-martensite transformation can vary depending on the particular application and its thermal environment, the composition of and particular SMA materials being used, and/or amount and rate of cooling or heat transfer from the two-way SMA actuator.

Cooling the two-way shape memory alloy can include passive cooling, active cooling, a combination thereof, etc. In one embodiment, the two-way shape memory alloy is passively cooled through heat exchange with its surrounding environment (e.g., structure, ambient atmosphere, etc.) once the supply of electrical power to the heating device is cutoff. Alternatively or additionally, the two-way shape memory alloy can be actively cooled, for example, if a higher rate of transformation to the martensitic state and shape is desired. By way of example, the two-way shape memory alloy can be actively cooled by circulating coolant over the two-way SMA actuator.

By way of further example, the two-way shape memory alloy can be actively cooled by supplying electrical power to a thermoelectric device having one side thermally coupled to the shape memory alloy. The thermoelectric device has the characteristic that heat flows from one side of the thermoelectric device to the other side. Accordingly, shape memory alloy can be cooled if it is thermally coupled to the cooled side of the thermoelectric device. Advanced thermoelectric devices are disclosed in U.S. Pat. No. 6,100,463, the contents of which are incorporated by reference herein in their entirety.

Figure 7:
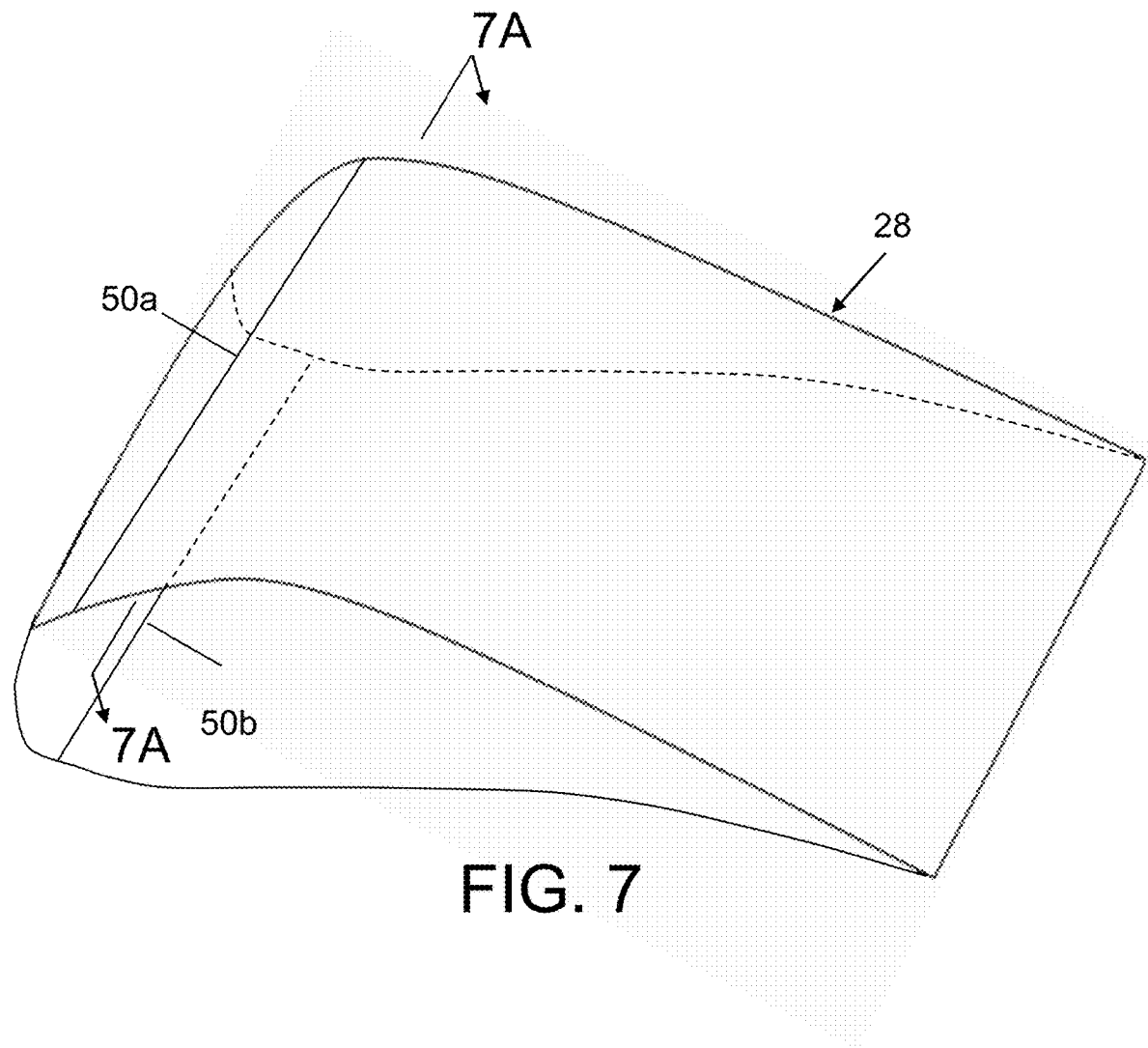
FIG. 7 is a diagram representing an isometric view of a wing trailing edge flight control surface that incorporates SMA actuators in accordance with another embodiment.
Figure 7A:
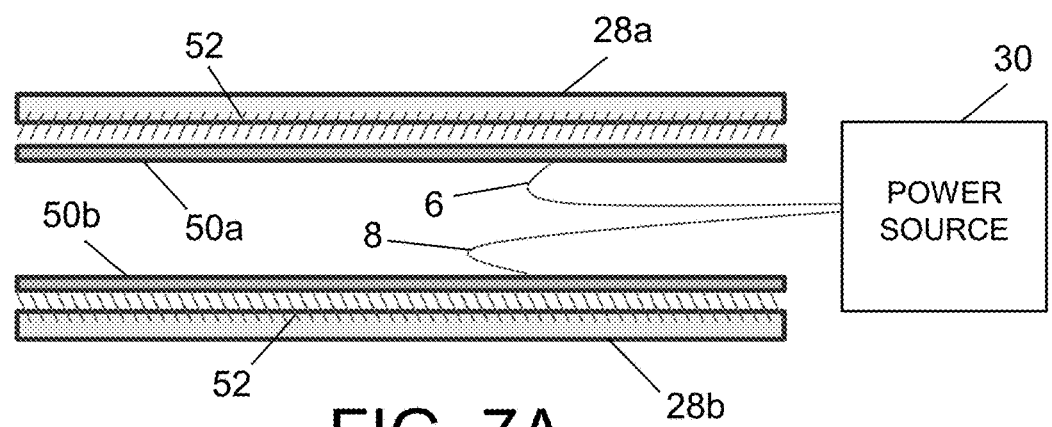
FIG. 7A is a diagram representing a sectional view of the wing trailing edge flight control surface schematically depicted in FIG. 7, the section being taken through a plane 7A-7A indicated in FIG. 7.

FIG. 7 is a diagram representing an isometric view of an SMA-actuated wing trailing edge flight control surface in accordance with another embodiment. FIG. 7A is a diagram representing a sectional view of the wing trailing edge flight control surface schematically depicted in FIG. 7, the section being taken through a plane 7A-7A indicated in FIG. 7. In this embodiment, electrical current is induced in SMA wires (not shown in FIG. 7) embedded in thermoplastic material, which electrical current produces resistive heating of the SMA wires. As seen in FIG. 7A, the ends 52 of the SMA wires protrude out of the upper and lower skins 28*a* and 28*b* respectively. The ends 52 of SMA wires in the upper skin 28*a* are electrically connected to transverse electrical conductors 50*a*, which are in turn electrically connected to the power source 30 by means of electrical conductors 6. Similarly, the ends 52 of SMA wires in the lower skin 28*b* are electrically connected to transverse electrical conductors 50*b*, which are in turn electrically connected to the power source 30 by means of electrical conductors 8. When the electrical power is turned on, the SMA wires are heated; when the electrical power is turned off, the SMA wires can be cooled by the ambient air.

Figure 8:
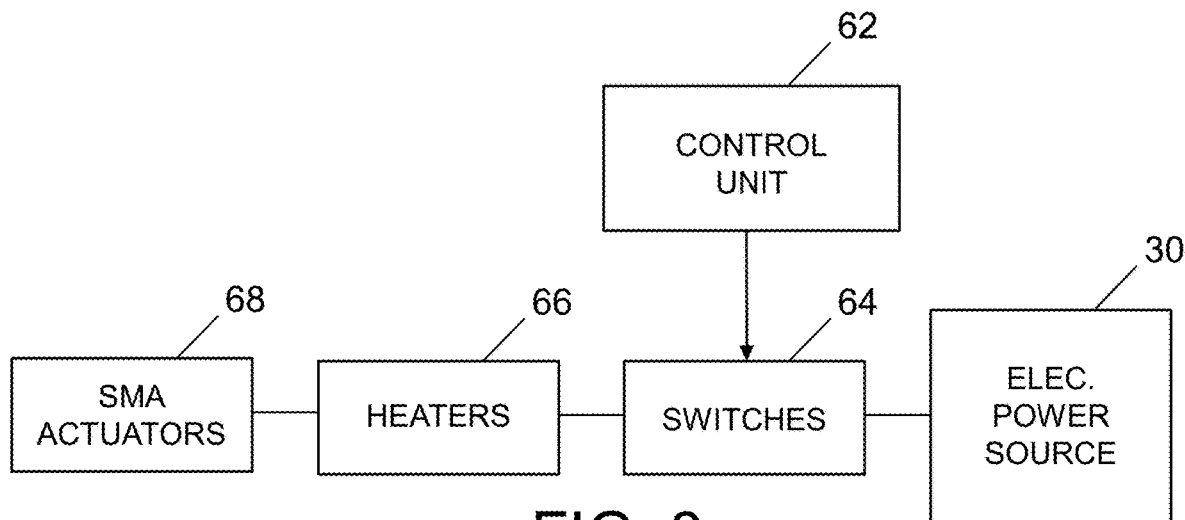
FIG. 8 is a block diagram showing components of a system for actuating a control surface of an aircraft using shape memory alloy material.

FIG. 8 is a block diagram showing components of a system for actuating a flight control surface of an aircraft using shape memory alloy material. The state of the SMA actuators can be controlled automatically in response to flight conditions. The shape of the flight control surface will depend on the amount of heat provided to the SMA actuators 68 by the associated electric heaters 66. This is controlled by a control unit 62, which controls the state of switches 64 disposed between the electric heaters 66 and the electrical power source 30. The control unit 62 may comprise a computer system programmed to provide pulses or bursts of electrical power to the electric heaters 66 to maintain the SMA actuators 68 in specific configurations. The control unit 62 is programmed to send a specific number of pulses to each heater 66 (not necessarily an identical number of pulses to each heater) to deform each SMA actuator 68 into respective shapes that correspond to the target configurations. The control unit 62 may receive position feedback signals representing the actual (i.e., current) flight control surface positions from sensors (not shown). In response to these position feedback signals, the control unit 62 will provide either more or fewer current pulses to keep each heater at a specific temperature and subsequently each flight control surface at target position.

Figure 9:
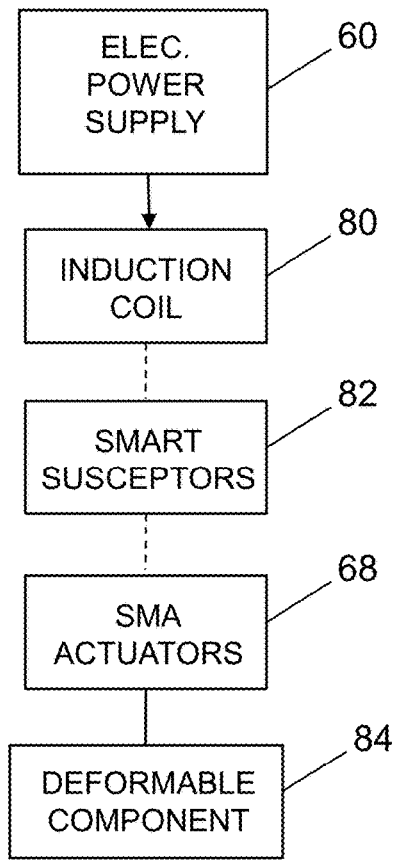
FIG. 9 is a block diagram showing components of an adaptive composite structure in which SMA actuators are heated by inductively heated smart susceptors in accordance with a further embodiment.

FIG. 9 is a block diagram showing components of an adaptive composite structure in which SMA actuators 68 are heated by inductively heated smart susceptors 82 in accordance with a further embodiment. The SMA actuators 68 and smart susceptors 82 are incorporated in a deformable component 84. The deformable component 84 further incorporates an induction coil 80, which can receive electrical current from an electrical power supply 60. In response to energization of the induction coil 80, an alternating magnetic field is produced which induces eddy currents in the smart susceptors 82. These eddy currents are transformed into heat energy by the susceptor material. The SMA actuators are disposed in a manner such that they will be heated by the heat produced by the smart susceptors 82. During flight, the smart susceptor 82 (which may take the form of wires) will activate the SMA materials in a range of 250 to 400° F.

Figure 10:
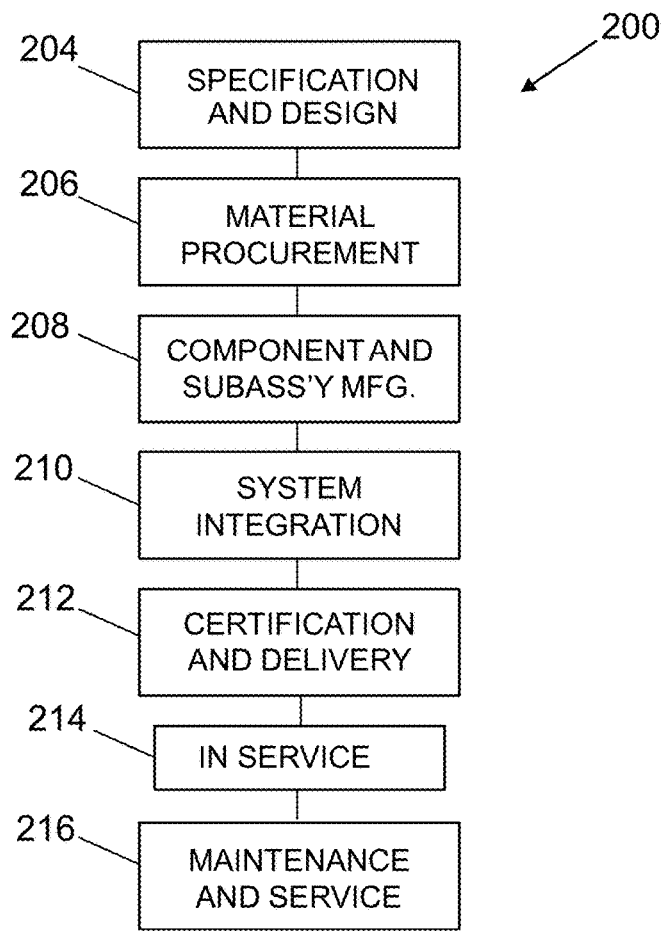
FIG. 10 is a flow diagram of an aircraft production and service methodology.
Figure 11:
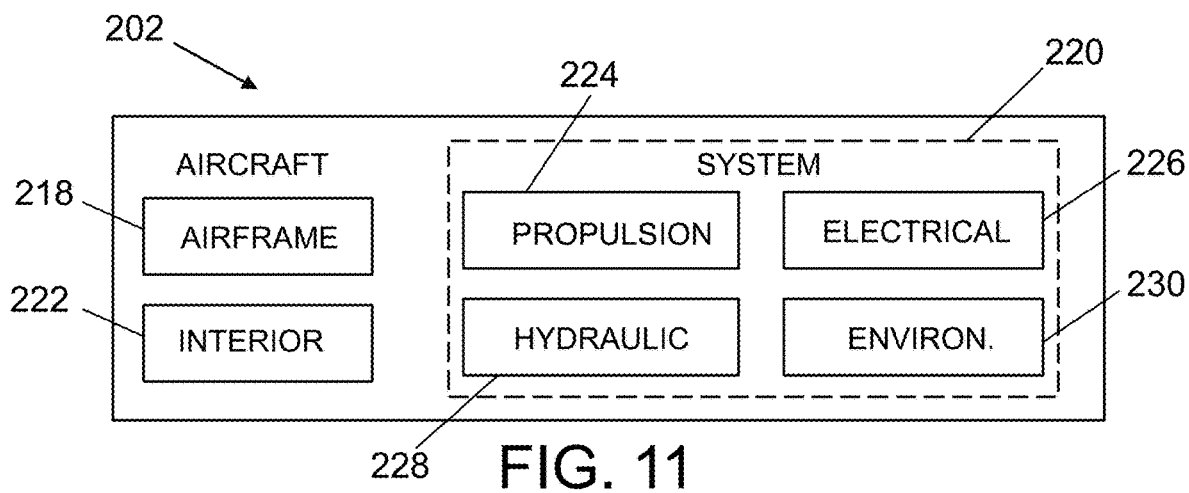
FIG. 11 is a block diagram showing systems of an aircraft.

The system and methods disclosed above may be employed in an aircraft manufacturing and service method 200 as shown in FIG. 10 for fabricating components of an aircraft 202 of a type depicted in FIG. 11. During preproduction, exemplary method 200 may include specification and design 204 of the aircraft 202 and material procurement 206. During production, component and subassembly manufacturing 208 and system integration 210 of the aircraft 202 takes place. Thereafter, the aircraft 202 may go through certification and delivery 212 in order to be placed in service 214. While in service by a customer, the aircraft 202 is scheduled for routine maintenance and service 216 (which may also include modification, reconfiguration, refurbishment, and so on).

Each of the processes of method 200 may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

As shown in FIG. 11, the aircraft 202 produced by exemplary method 200 may include an airframe 218 (comprising, e.g., a fuselage, frames, stiffeners, wing boxes, etc.) with a plurality of systems 220 and an interior 222. Examples of high-level systems 220 include one or more of the following: a propulsion system 224, an electrical system 226, a hydraulic system 228, and an environmental control system 230. Any number of other systems may be included.

Although an aerospace example is shown, the principles disclosed herein may be applied to other industries.

Apparatus and methods embodied herein may be employed during one or more of the stages of the production and service method 200. For example, components may be fabricated during production process 208 using the techniques disclosed herein. Also, one or more apparatus embodiments, method embodiments, or a combination thereof may be utilized during the production stages 208 and 210, for example, by substantially expediting assembly of or reducing the cost of an aircraft 202.

While systems and methods for fabricating adaptive composite structures using SMA material have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

In addition, the method claims set forth hereinafter should not be construed to require that the steps recited therein be performed in alphabetical order (any alphabetical ordering in the claims is used solely for the purpose of referencing previously recited steps) or in the order in which they are recited. Nor should they be construed to exclude any portions of two or more steps being performed concurrently or alternatingly.

As used in the claims, the term "inner layer" is not limited to being an innermost layer, but rather may also encompass an intermediate layer which is between an outermost layer and an innermost layer. Similarly, as used in the claims, the term "outer layer" is not limited to being an outermost layer, but rather may also encompass an intermediate layer which is between an outermost layer and an innermost layer. When used in conjunction, the "inner layer" is a layer which is inside the "outer layer".

The invention claimed is:

1. An aerodynamic device comprising first and second skins, each of the first and second skins comprising shape memory alloy and thermoplastic material, wherein the shape memory alloy is embedded in the thermoplastic material and wrapped around an inner mold line of the aerodynamic device, and further comprising a first heating blanket adhered to an interior surface of the first skin, wherein the shape memory alloy of the first skin comprises an active portion embedded in the thermoplastic material of the first skin in an area overlapping the first heating blanket, and the first heating blanket comprises conductive foil in a serpentine pattern.

2. The aerodynamic device as recited in claim 1, wherein the first skin is a lamination comprising an inner layer comprising shape memory alloy and an outer layer comprising thermoplastic material without shape memory alloy, the inner layer being disposed inside the outer layer.

3. The aerodynamic device as recited in claim 2, wherein the inner layer comprises thermoplastic material and tapes made of shape memory alloy at least partly embedded in the thermoplastic material of the inner layer and wrapped around the inner mold line of the aerodynamic device.

4. The aerodynamic device as recited in claim 2, wherein the inner layer comprises thermoplastic material and wires made of shape memory alloy at least partly embedded in the thermoplastic material of the inner layer and wrapped around the inner mold line of the aerodynamic device.

5. The aerodynamic device as recited in claim 1, wherein the shape memory alloy of the first skin comprises tapes made of shape memory alloy material embedded in the thermoplastic material and wrapped around the inner mold line of the aerodynamic device.

6. The aerodynamic device as recited in claim 1, wherein the shape memory alloy of the first skin comprises wires made of shape memory alloy material embedded in the thermoplastic material and wrapped around the inner mold line of the aerodynamic device.

7. The aerodynamic device as recited in claim 1, further comprising a second heating blanket adhered to an interior surface of the second skin, wherein the shape memory alloy of the second skin comprises an active portion embedded in the thermoplastic material of the second skin in an area overlapping the second heating blanket, and the second heating blanket comprises conductive foil in a serpentine pattern.

8. The aerodynamic device as recited in claim 7, wherein the first and second skins form an airfoil-shaped body having a chord and a forward portion.

9. The aerodynamic device as recited in claim 8, wherein the active portions of the shape memory alloy are capable of producing chordwise changes in the contours of the upper and lower skins when the shape memory alloy is heated.

10. The aerodynamic device as recited in claim 8, wherein the forward portion is made of a material which is not susceptible to heat-induced shape change.

11. The aerodynamic device as recited in claim 10, wherein the forward portion is made of shape memory alloy which has not been trained to change shape at a transition temperature.

12. The aerodynamic device as recited in claim 1, wherein at least some of the shape memory alloy of the first skin and at least some of the shape memory alloy of the second skin has been trained to deform in a specified manner in response to being heated.

13. The aerodynamic device as recited in claim 12, wherein the trained shape memory alloy has been trained to change shape in a manner that produces a constrained motion of the aerodynamic device in response to being heated.

14. The aerodynamic device as recited in claim 1, wherein the first and second skins have an outer mold line which changes shape as the thermoplastic material deforms in response to heating of the shape memory alloy.

15. The aerodynamic device as recited in claim 1, wherein the first skin comprises a woven or continuous layer of shape memory alloy material sandwiched between two woven or continuous layers of thermoplastic material.

16. The aerodynamic device as recited in claim 1, wherein the thermoplastic material comprises polyetherketoneketone resin and polyester fibers.

17. The aerodynamic device as recited in claim 1, wherein the shape memory alloy of the first skin is not exposed on an exterior surface of the first skin.

18. The aerodynamic device as recited in claim 1, wherein the shape memory alloy of the first skin is configured to form a pair of mutually antagonistic one-way shape memory alloy actuators.

19. The aerodynamic device as recited in claim 1, wherein the shape memory alloy of the first skin is configured to form a two-way shape memory alloy actuator.

20. The aerodynamic device as recited in claim 1, wherein the conductive foil is embedded in a dielectric matrix.

* * * * *